(12) United States Patent
Suzawa et al.

(10) Patent No.: US 6,372,523 B1
(45) Date of Patent: Apr. 16, 2002

(54) ETCHING METHOD AND ETCHING DEVICE

(75) Inventors: Hideomi Suzawa; Tomohiko Sato; Yoshihiro Kusuyama; Koji Ono, all of Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/358,397

(22) Filed: Jul. 22, 1999

(30) Foreign Application Priority Data

Jul. 24, 1998 (JP) .............................. 10-209648

(51) Int. Cl.⁷ .................. H01L 21/00; H01L 21/66; H01L 21/302; H01L 21/3065
(52) U.S. Cl. ............... 438/5; 438/7; 438/9; 438/10; 438/14; 438/16; 438/17; 438/706
(58) Field of Search ................ 438/706, 14, 16, 438/17, 5, 7, 9, 10

(56) References Cited

U.S. PATENT DOCUMENTS 5,653,894 A * 8/1997 Ibbotson et al. ............. 216/59
5,668,019 A * 9/1997 Kobayashi et al. ......... 438/163

FOREIGN PATENT DOCUMENTS

| JP | 5-6873 | 1/1993 |
|----|--------|--------|
| JP | 5-29277 | 2/1993 |
| JP | 5-152253 | 6/1993 |
| JP | 8-288258 | 11/1996 |

OTHER PUBLICATIONS

Herbert, et al., Process for the Anisotropic and Selective Dry Etching of Nitride Over Thin Oxides, WO 96/16433 (PCT/US95/15474), 13 pages, May 1996.*

* cited by examiner

Primary Examiner—Benjamin L. Utech
Assistant Examiner—Lynette T. Umez-Eronini
(74) Attorney, Agent, or Firm—Eric J. Robinson; Nixon Peabody LLP

(57) ABSTRACT

An etching method and a device therefor are provided to detect the etching end point with high accuracy and reproducibility. In an etching method and device, in dry etching, a variation of a self-bias voltage as a time elapses is measured, and a time where a differentiation value becomes 0 when the variation of the self-bias voltage is differentiated is regarded as an end point.

22 Claims, 5 Drawing Sheets

ETCHING METHOD AND ETCHING DEVICE

BACKGROUND OF THE INVENTION

1. Field of the Invention

The present invention relates to a dry etching method in which an end point of the etching is detected when etching a film formed on a substrate. Also, the present invention relates to an etching method for forming an active layer comprising silicon and electrodes comprising metal of a semiconductor device, such as a thin film transistor.

2. Description of the Related Art

In a process of producing a semiconductor device such as an LSI, a super LSI or a thin-film transistor (TFT), an etching process is conducted for making a film formed on a substrate into a desired shape. The etching process may be conducted by dry etching, wet etching or the like. One of general TFT structures and one of methods for fabricating thin film transistors are disclosed in U.S. Pat. No. 5,534,716. The entire disclosure of U.S. Pat. No. 5,534,716 including specification, claims, drawings and summary are incorporated herein by reference in its entirety.

A method most used for detecting the end point of the etching in the dry etching is a spectrochemical analyzing method. In this method, the end point of the etching is judged by allowing a spectrum emitted from a reaction product of an etching gas in plasma or a reaction product of a film to be etched to pass through a spectroscope or the like to read a variation in the intensity of light emission.

However, there is a case in which the end point of the etching can not be detected because the variation in the intensity of light emission is small depending on the light emission species from which the spectrum for detecting the end point of the etching is emitted. Also, there is a case in which the end point of the etching can not be detected because a wavelength to be spectrochemically analyzed is superimposed on another wavelength depending on the combination of a film to be etched with an etching gas.

In addition, there arises such a problem that the detection of the end point high in accuracy and excellent in reproducibility can not be performed because the reaction product is deposited on a window defined in the reaction chamber for detecting the spectrum to make the intensity of a light that passes through the window low.

In particular, as the high integration of the semiconductor devices is progressed, it becomes important that the end point of the etching is accurately caught in order to form a fine pattern high in accuracy with an excellent reproducibility.

SUMMARY OF THE INVENTION

The present invention has been made in order to solve the above-mentioned problems, and therefore has an object of the present invention to detect an end point of the etching high in accuracy and excellent in reproducibility.

According to one aspect of the present invention disclosed in the present specification, there is provided a method of etching a film formed on a substrate by dry etching, characterized by comprising the steps of: measuring a variation in a self-bias voltage, and setting a time point when the variation in the self-bias voltage comes to a fixed value as an end point of the etching.

Further, in the above-mentioned structure, it is characterized in that the time point when the variation in the self-bias voltage comes to the fixed value is a time point when a differentiation value becomes 0 if the variation in the self-bias voltage is differentiated.

According to another aspect of the present invention, there is provided a method of etching a film formed on a substrate by dry etching, comprising the steps of:
measuring a light emission from a light emission species existing in a reaction chamber during etching and a variation in a self-bias voltage; and
setting a time period when a difference between the self-bias voltage and the intensity of the light emission becomes a fixed value as an end point of the etching.

Also, in the above-mentioned structure, it is characterized in that the time point when the difference comes to the fixed value is a time point when a differentiation value becomes 0 if a variation in the difference between the self-bias voltage and the intensity of the light emission is differentiated.

Further, an etching device according to another aspect of the present invention comprises:
an anode and a cathode disposed in a reaction chamber;
a high-frequency power supply connected to the cathode through a matching box; and
a voltmeter connected to the cathode for measuring a self-bias voltage;
characterized in that the self-bias voltage is monitored by the voltmeter to detect an end point of the etching.

Also, an etching device according to further another aspect of the present invention comprises:
an anode and a cathode disposed in a reaction chamber;
a high-frequency power supply connected to the cathode through a matching box;
a voltmeter connected to the cathode for measuring a self-bias voltage;
a window disposed within the reaction chamber; and
a detector for detecting a light emission of a light emission species occurring within the reaction chamber through the window via a spectroscope;
characterized in that a difference between the intensity of the light emission and the self-bias voltage is monitored by the voltmeter to detect an end point of the etching.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

Figure 1:
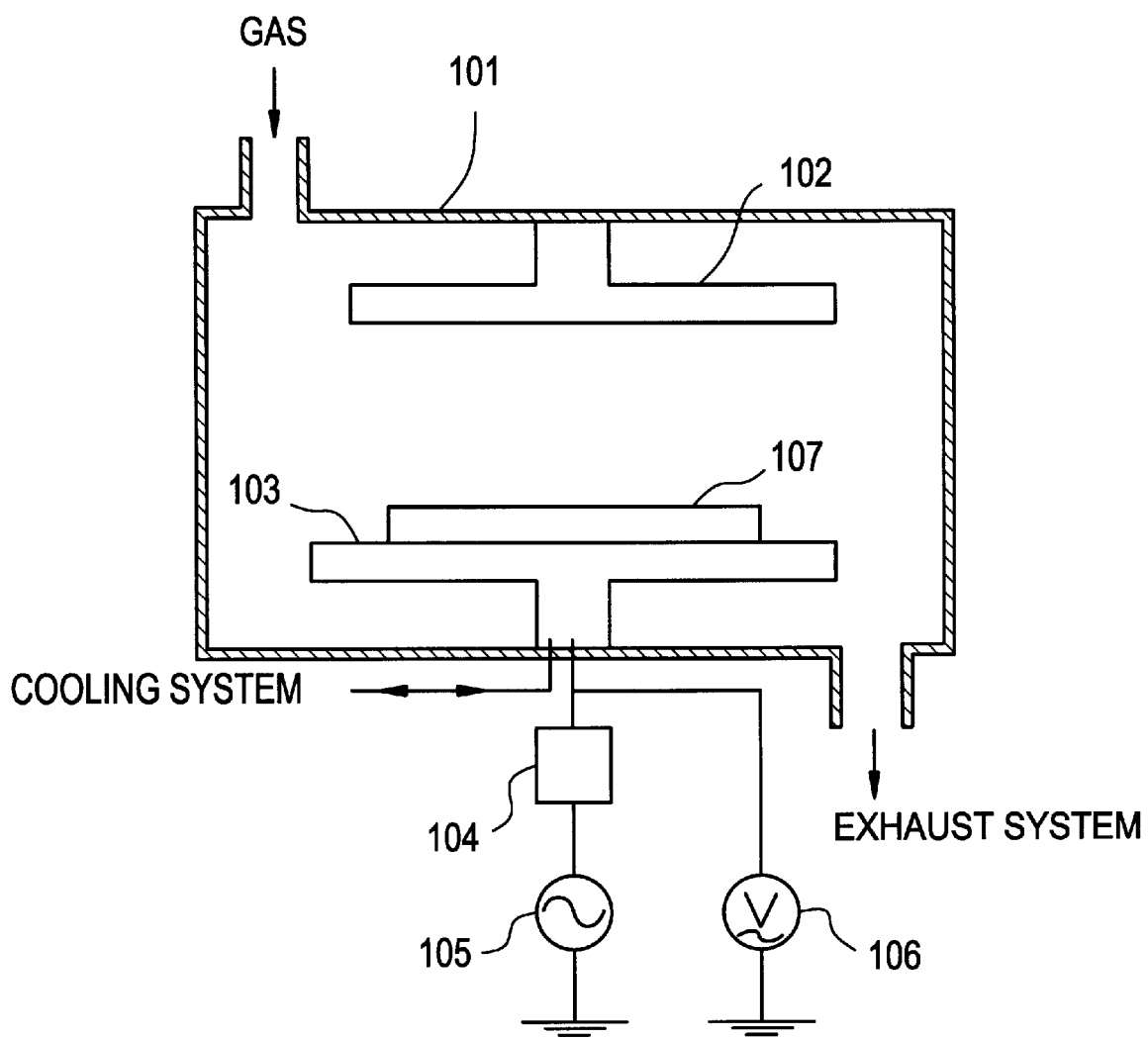
FIG. 1 is a diagram showing a dry etching device according to an embodiment 1 of the present invention.

FIG. 1 shows a schematic diagram of a dry etching device. An anode 102 and a cathode 103 are disposed in a reaction chamber 101. Also, the reaction chamber 101 is connected to an exhaust system. The cathode 103 is connected with a high-frequency power supply 105 through a matching box 104 and also with a voltmeter 106 for measuring a self-bias voltage $V_{dc}$. Also, there is provided a cooling system for cooling the cathode 103.

In etching, a substrate 107 on which a film to be etched is formed is disposed on the cathode 103, and an etching gas is introduced into the reaction chamber 101. Then, a high-frequency power is applied to the cathode 103 by the high-frequency power supply 105 to generate a plasma between the anode 102 and the cathode 103.

In the plasma, there exists ions that are the reaction products of the etching gas, and the ions are accelerated by an electric field and collide with the film formed on the substrate 107 to generate a chemical reaction, thus conducting etching.

Figure 2:
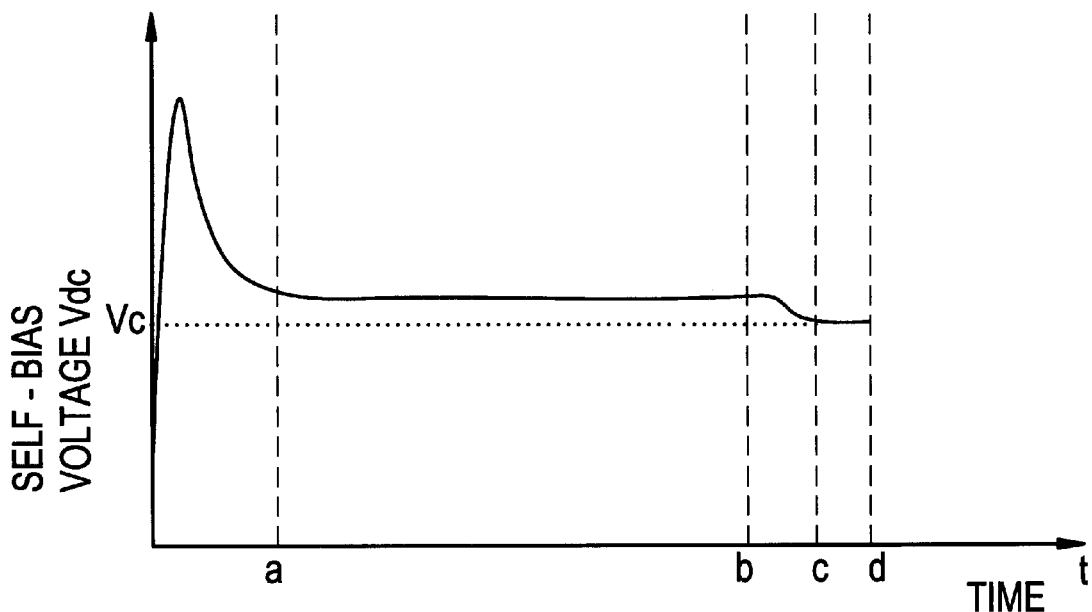
FIG. 2 is a graph showing a variation of a self-bias voltage as a time elapses.

FIG. 2 shows a variation of the self-bias voltage $V_{dc}$ measured by the voltmeter 106 during etching. When the high-frequency power supply 105 turns on, the self-bias voltage rapidly rises and thereafter drops so as to be maintained constant in a duration between a and b. In the duration between a and b, since etching is stably conducted and a ratio of ions existing in the plasma is balanced and maintained constant, the self-bias voltage is maintained constant.

Thereafter, as the film to be etched is eliminated, the ratio of ions existing in the plasma changes, and the self-bias voltage changes (between b and c).

Then, when the film which is being etched is completely eliminated, the self-bias voltage is again maintained constant such that over-etching occurs in a duration between c and d.

In this way, since the variation of the self-bias voltage corresponds to an etching state, the end point of the etching can be detected by measuring the self-bias voltage, and a time when the self-bias voltage becomes constant again can be set as an end point c of etching.

As a specific method, the self-bias voltage is measured in advance, a certain self-bias voltage value is determined from that data, and a time when the self-bias voltage becomes that value is regarded as the end point of the etching. Then, an over-etching period is set with reference to the end point of the etching.

The fixed value of the self-bias voltage is a value of the self-bias voltage when a differentiation value becomes 0 when the variation of the self-bias voltage is differentiated.

In this way, with the monitoring of the self-bias voltage, even if the reaction products are deposited on an inner wall of the reaction chamber, the end point of the etching can be detected with a high accuracy, and a fine pattern high in accuracy can be formed with an excellent reproducibility. Further, since the etching end point detecting method enables the end point to be readily automatically detected, the etching process can be automatically performed.

Also, the end point of the etching can be detected even if a wavelength to be spectrochemically analyzed is superimposed on another wavelength depending on the combination of the film to be etched with the etching gas.

In addition, if the self-bias voltage is measured in advance, since the self-bias voltage fluctuates when the electrodes are deteriorated, the deterioration of the electrodes can be readily judged without opening the chamber.
(Embodiment 1)

In this embodiment, a case in which a silicon film formed on an insulating substrate is etched by use of the dry etching device shown in FIG. 1 will be described.

The interior of the reaction chamber 101 is put in a predetermined low pressure state by an exhaust system, and the substrate 107 is disposed on the cathode 103. A silicon film is formed on the substrate 107, and the silicon film is masked in predetermined shape.

In addition, $CF_3$ is introduced into the reaction chamber at the flow rate of 50 sccm and $O_2$ is introduced thereinto at the flow rate of 45 sccm as the etching gas. Also, a pressure within the reaction chamber is held at 100 mTorr by the exhaust system.

Then, a high-frequency voltage of 500 W is applied to the cathode 103 by the high-frequency power supply 105 to generate a plasma, thus starting etching. Simultaneously, the self-bias voltage $V_{dc}$ is measured by the voltmeter 106.

Figure 3:
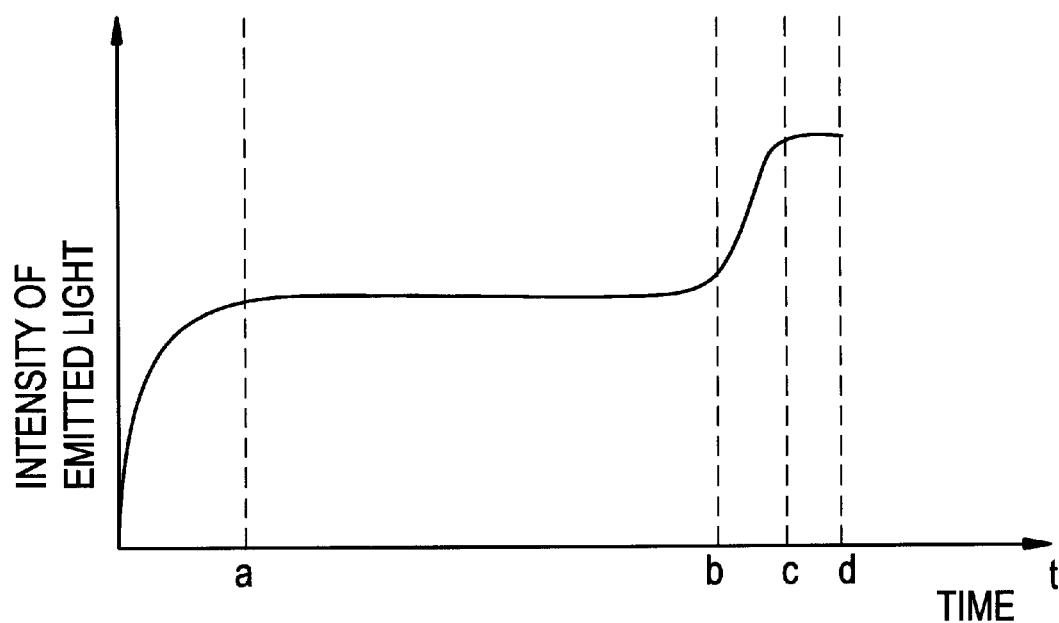
FIG. 3 is a graph showing a variation of the intensity of emitted light as a time elapses.

FIG. 2 shows a variation of the self-bias voltage $V_{dc}$ measured in this embodiment in which the axis of abscissa is a time t whereas the axis of ordinate is the self-bias voltage $V_{dc}$. As a comparative example, FIG. 3 shows a graph in which a light emission ($\lambda$=704 nm) from F (fluorine) existing in the plasma is monitored during etching. In the figure, the axis of abscissa is a time t whereas the axis of ordinate is the intensity of the emitted light.

Upon application of a high-frequency voltage, after the self-bias voltage rises, it drops and is maintained constant. On the other hand, the intensity of the emitted light increases and is maintained constant. In the duration between a and b where the self-bias voltage is maintained constant, since the amount of producing F radical and the amount of consuming (reacting) F radical are identical with each other, the intensity of the emitted light is maintained constant.

As etching draws to a termination, the self-bias voltage drops and the intensity of the emitted light increases (between b and c). The increase in the intensity of the emitted light is because the consumption of F decreases such that the amount of F increases since the silicon film to be etched is eliminated.

Then, when the silicon film to be etched is eliminated, the self-bias voltage as well as the intensity of the emitted light is maintained constant (between c and d).

In this way, the variation in the self-bias voltage is substantially synchronous with the change in the intensity of the emitted light and also corresponds to the etching state. Accordingly, the end point c of etching can be detected by monitoring the self-bias voltage.

Incidentally, the end point c is when the variation in the self-bias voltage is differentiated and the differentiation value becomes 0.

In this embodiment, the self-bias voltage value $V_c$ at the time of the end point c is measured in advance. Then, the self-bias voltage is measured during etching, and when it becomes the self-bias voltage $V_c$, an over-etching time is taken and etching is terminated.

Also, in this embodiment, the self-bias voltage value measured by the voltmeter 106 is used as it is for judgement of the end point of the etching. However, if a signal (the self-bias voltage value) from the voltmeter 106 is amplified by an electric circuit, the end point of the etching can be detected more accurately.

In addition, in this embodiment, the silicon film is used as a film to be etched, and $CF_4$ and $O_2$ are used as etching gases. However, the present invention can be implemented even if the combination of another film to be etched with other etching gases is employed. In this case, since the end point of the etching depends on the kind and the thickness of the film to be etched and the etching gases, it is necessary that the end point of the etching in the respective conditions is measured.

(Embodiment 2)

In this embodiment, a method of detecting the end point of the etching higher in reliability than that in the embodiment 1 will be described.

Figure 5:
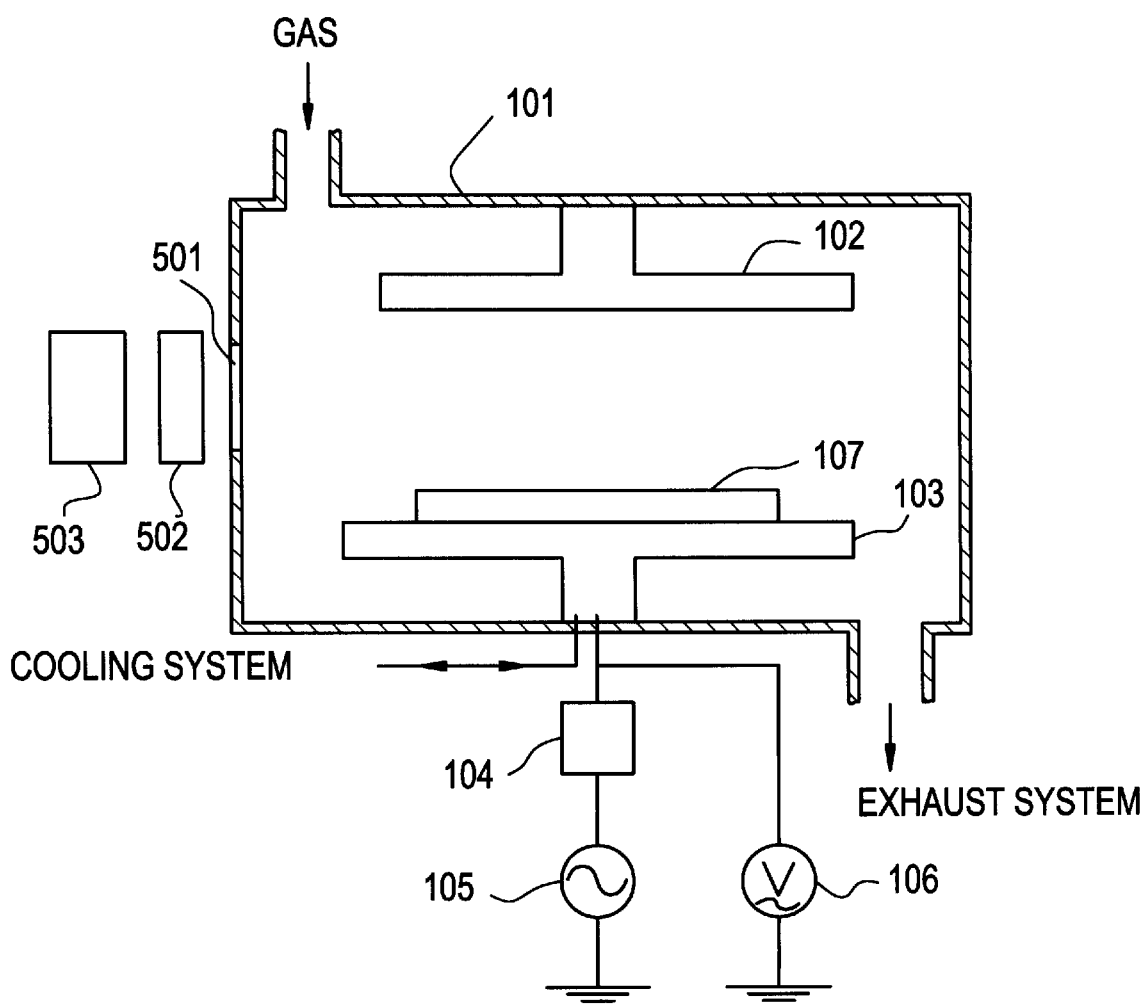
FIG. 5 is a diagram showing a dry etching device according to an embodiment 2 of the present invention.

FIG. 5 shows a dry etching device used in this embodiment. The dry etching device is designed in such a manner that a light emitted from a light emission species in plasma can be detected by a detector 503 through a spectroscope 502 from a window 501. Other structures are identical with those in FIG. 1.

A case in which a silicon film formed on an insulating substrate is etched by using the above-mentioned device will be described. The etching conditions are identical with those in the embodiment 1.

Figure 4:
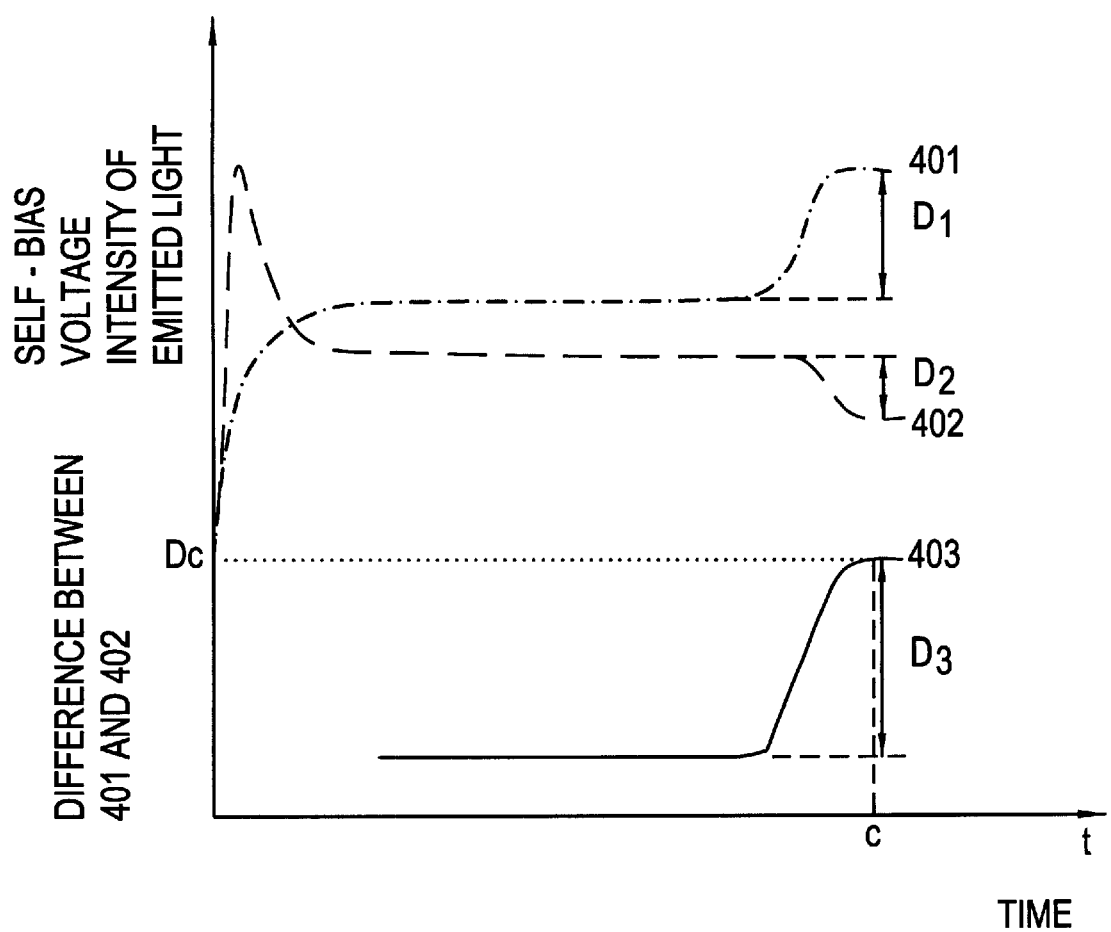
FIG. 4 is a graph showing the differences in the self-bias voltage, the intensity of emitted light and a difference between the self-bias voltage and the intensity of emitted light as a time elapses.

A substrate 107 is disposed within a reaction chamber 101, $CF_4$ and $O_2$ are introduced into the reaction chamber 101, and a high-frequency voltage is applied to a cathode 103, thus starting etching. In this situation, a self-bias voltage $V_{dc}$ is detected by a voltmeter 106, and the intensity of emitted light is measured from F by the is detector 503. In FIG. 4, reference numeral 401 denotes a variation in the intensity of the emitted light as a time elapses, and 402 is a variation in the self-bias voltage as a time elapses.

Then, a difference between the intensity of the emitted light and the self-bias voltage is taken. What is indicated by numeral 403 is a graph in which the difference between the intensity of the emitted light and the self-bias voltage is taken. The difference appearing when the measurement starts is omitted from the graph.

In this way, the end point c of etching is detected from the graph 403, the over-etching time is taken and etching is terminated. The difference $D_c$ between the intensity of the emitted light and the self-bias voltage at the time of the end point c is measured in advance, and a time when the difference between the intensity of the emitted light and the self-bias voltage becomes $D_c$ is set as the end point. The end point c is when the difference between the intensity of the emitted light and the self-bias voltage is differentiated, and the differentiation value becomes 0.

In this way, if the difference between the intensity of the emitted light and the self-bias voltage is taken, a change between a constant state during etching and a state after etching can be made large. In other words, a variation $D_3$ in the difference between the intensity of the emitted light and the self-bias voltage is larger than the variation $D_1$ in the intensity of the emitted light and the variation $D_2$ in the self-bias voltage. This makes the reliability of the detection of the etching end point improve.

Also, if the self-bias voltage value and the intensity of the emitted light are amplified by an electric circuit, the end point of the etching can be detected more accurately.

In addition, in this embodiment, the silicon film is used as a film to be etched, and $CF_4$ and $O_2$ are used as etching gases. However, the present invention can be implemented even if the combination of another film to be etched with other etching gases is employed.

(Embodiment 3)

In this embodiment, a case in which titanium (Ti) film is etched will be described.

Figure 6:
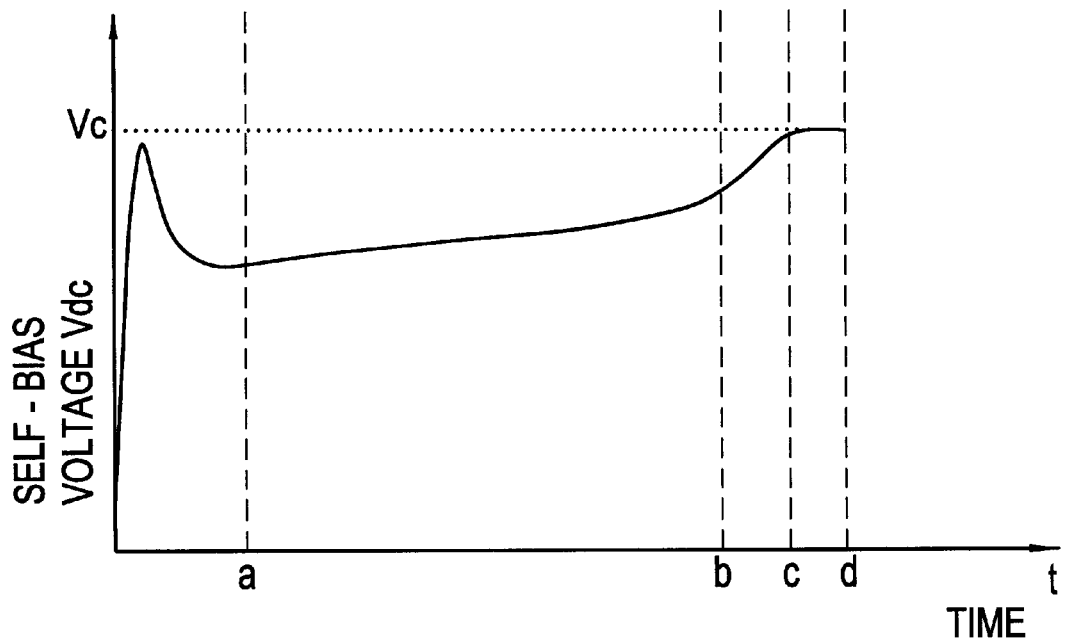
FIG. 6 is a graph showing a variation of a self-bias voltage as a time elapses according to an embodiment 3 of the present invention.

FIG. 6 shows a variation in the self-bias voltage $V_{dc}$ when a titanium film is etched. Conditions in this example are that the thickness of the titanium film is about 3,000 Å, the etching gas is $SiCl_4/Cl_2$=40/30 sccm, a pressure within the reaction chamber is 80 mTorr and a high-frequency voltage is 1,200 W.

Figure 7:
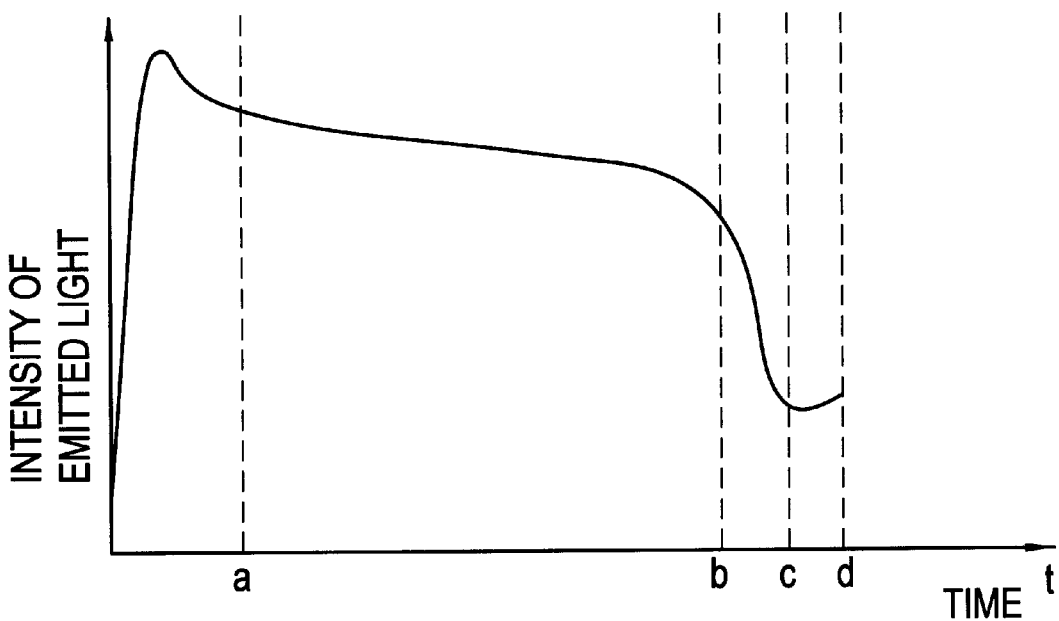
FIG. 7 is a graph showing a variation of the intensity of emitted light as a time elapses according to the embodiment 3 of the present invention.

Also, FIG. 7 shows the intensity of a light (wavelength 396 nm) emitted from titanium which is measured at the same time. In FIG. 7, since the titanium film is etched and titanium is flown in plasma till a time b, a light emitted from the titanium is observed. Then, as the etching of the titanium film approaches to a termination, the intensity of the emitted light becomes small, and the etching becomes ended at a time c. Then, the over-etching time is taken, and etching is terminated at a time d.

On the other hand, a variation in the self-bias voltage in FIG. 6 also nearly corresponds to a variation in the intensity of the emitted light in FIG. 7, and the self-bias voltage is maintained constant at the end point c. In this way, similarly, in the case where the titanium film is etched, the end point c of etching can be readily detected by monitoring the self-bias voltage. The end point c is when the variation in the self-bias voltage is differentiated, and the differentiation value becomes 0.

In fact, the self-bias voltage value $V_c$ at the end point c is measured in advance, the self-bias voltage is measured during etching, and when it becomes the self-bias voltage $V_c$, the over-etching time is taken to terminate etching. In this embodiment, a period of time till the end point c is 200 sec, and a period of time of over-etching is 60 sec.

Also, if a signal (the self-bias voltage value) from the voltmeter 106 is amplified by an electric circuit, the end point of the etching can be detected more accurately.

In addition, as in the embodiment 2, the difference between the self-bias voltage and the intensity of the emitted light is taken so that an accuracy in the detection of the etching end point can be improved.

As was described above, in dry etching, the end point of the etching can be detected with high accuracy and excellent reproducibility by detecting the end point of the etching according to the variation of the self-bias voltage regardless of the combination of the film to be etched with the etching gas.

Also, the end point of the etching can be detected with more reliability by taking the difference between the intensity of the emitted light and the self-bias voltage.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of etching a film formed over a substrate by dry etching, comprising the steps of:

preparing said film formed over said substrate in a reaction chamber;

supplying an etching gas in said reaction chamber;

applying a high-frequency voltage to generate a plasma for etching said film;

measuring a variation in a self-bias voltage and a variation in an intensity of a light emission from a light emission species existing in said reaction chamber, respectively, and taking a difference between said self-bias voltage and the intensity of said light emission during said etching; and stopping said etching after said difference becomes a fixed value.

2. A method according to claim 1, wherein said film comprises a semiconductor material.

3. A method according to claim 1, wherein said film comprises a conductor material.

4. A method of etching a film formed over a substrate by dry etching, comprising the steps of:
- preparing said film formed over said substrate in a reaction chamber;
- supplying an etching gas in said reaction chamber;
- applying a high-frequency voltage to generate a plasma for etching said film;
- measuring a variation in a light emission intensity from a light emission species existing in a reaction chamber during etching and a variation in a self-bias voltage, respectively, and taking a difference between said self-bias voltage and said light emission intensity during said etching; and
- stopping said etching after a differentiation value of said difference becomes 0.

5. A method according to claim 4, wherein said film comprises a semiconductor material.

6. A method according to claim 4, wherein said light emission species is a reaction product originated from said film.

7. A method according to claim 4, wherein said light emission species is a reaction product originated from an etching gas.

8. A method according to claim 4, wherein said film comprises a conductor material.

9. A method of fabricating a semiconductor device comprising at least a step of:
- preparing said film formed over said substrate in a reaction chamber;
- supplying an etching gas in said reaction chamber;
- applying a high-frequency voltage to generate a plasma for etching said film;
- measuring a variation in a self-bias voltage and a variation in an intensity of a light emission from a light emission species existing in said reaction chamber, respectively, and taking a difference between said self-bias voltage and the intensity of said light emission during said etching; and
- stopping said etching after said difference becomes a fixed value.

10. A method according to claim 9, wherein said film comprises a semiconductor material.

11. A method according to claim 9, wherein said film comprises a conductor material.

12. A method of fabricating a semiconductor device comprising at least a step of:
- preparing a film formed over said substrate in a reaction chamber;
- supplying an etching gas in said reaction chamber;
- applying a high-frequency voltage to generate a plasma for etching said film;
- measuring a variation in a light emission intensity from a light emission species existing in a reaction chamber during etching and a variation in a self-bias voltage, respectively, and taking a difference between said self-bias voltage and said light emission intensity during said etching; and
- stopping said etching after a differentiation value of said difference becomes 0.

13. A method according to claim 12, wherein said film comprises a semiconductor material.

14. A method according to claim 12, wherein said light emission species is a reaction product originated from said film.

15. A method according to claim 12, wherein said light emission species is a reaction product originated from an etching gas.

16. A method according to claim 12, wherein said film comprises a conductor material.

17. A method for fabricating a thin film transistor comprising at least a step of:
- forming a semiconductor film comprising silicon over a substrate;
- setting said semiconductor film formed over said substrate in a reaction chamber;
- supplying an etching gas in said reaction chamber;
- applying a high-frequency voltage to generate a plasma for etching said film;
- measuring a variation in a self-bias voltage and a variation in an intensity of a light emission from a light emission species existing in said reaction chamber, respectively, and taking a difference between said self-bias voltage and the intensity of said light emission during said etching; and
- stopping said etching after said difference becomes a fixed value.

18. A method according to claim 17, wherein said semiconductor film comprises silicon.

19. A method of fabricating a thin film transistor comprising at least a step of:
- forming a semiconductor film comprising silicon over a substrate;
- setting said semiconductor film formed over said substrate in a reaction chamber;
- supplying an etching gas in said reaction chamber;
- applying a high-frequency voltage to generate a plasma for etching said film;
- measuring a variation in a light emission intensity from a light emission species existing in a reaction chamber during etching and a variation in a self-bias voltage, respectively, and taking a difference between said self-bias voltage and said light emission intensity during said etching; and
- stopping said etching after a differentiation value of said difference becomes 0.

20. A method according to claim 19, wherein said semiconductor film comprises silicon.

21. A method according to claim 19, wherein said light emission species is a reaction product originated from said semiconductor film.

22. A method according to claim 19, wherein said light emission species is a reaction product originated from an etching gas.

* * * * *